United States Patent
Goma et al.

[19]

[11] Patent Number: 6,104,255
[45] Date of Patent: Aug. 15, 2000

[54] VOLTAGE CONTROLLED OSCILLATOR WITH A RESONATOR COMMON TO A RESONANCE CIRCUIT AND AN OSCILLATION CIRCUIT AND A CAPACITOR

[75] Inventors: Shinji Goma; Takeshi Kataya, both of Komatsu, Japan

[73] Assignee: Murata Manufacturing Co., Ltd., Nagaokakyo, Japan

[21] Appl. No.: 09/131,667

[22] Filed: Aug. 10, 1998

[30] Foreign Application Priority Data

Aug. 27, 1997 [JP] Japan .................................... 9-231205

[51] Int. Cl.$^7$ ........................................ H03B 5/18
[52] U.S. Cl. ................... 331/117 D; 331/96; 331/117 V; 331/117 R
[58] Field of Search ...................... 331/36 C, 96, 331/117 R, 117 FE, 117 D, 107 DP, 107 SL, 177 V, 185, 186

[56] References Cited

U.S. PATENT DOCUMENTS

| 3,723,906 | 3/1973 | Pedersen | 331/117 D |
| 5,185,583 | 2/1993 | Ooi et al. | 331/15 |
| 5,512,862 | 4/1996 | Avanic et al. | 331/117 D |
| 5,576,667 | 11/1996 | Goma | 331/117 D |

FOREIGN PATENT DOCUMENTS 8-148933  6/1996  Japan .

*Primary Examiner*—David Mis
*Attorney, Agent, or Firm*—Burns, Doane, Swecker & Mathis, LLP

[57] ABSTRACT

A voltage controlled oscillation circuit includes a resonance circuit and an oscillation circuit. The oscillation circuit includes a capacitor, a variable capacitance diode, and a resonator composed of a strip line one end of which is grounded. The oscillation circuit includes an oscillation transistor, bias resistors, and, a Colpitts capacitor, a harmonic bypass capacitor, and a chip capacitor, one end of which is connected in series with a resistor and the other end of which is grounded. A node between the bias resistor and the chip capacitor connects the resonator composed of a strip line provided within the resonance circuit via a connection line, whereby the emitter of the oscillation transistor provided within the resonance circuit is grounded via the bias resistor and the resonator. In addition, a parallel resonance circuit is composed of the resonator and the chip capacitor.

13 Claims, 3 Drawing Sheets

VOLTAGE CONTROLLED OSCILLATOR WITH A RESONATOR COMMON TO A RESONANCE CIRCUIT AND AN OSCILLATION CIRCUIT AND A CAPACITOR

This application corresponds to Japanese Patent Application No. 9-231205, filed on Aug. 27, 1997, which is hereby incorporated by reference in its entirety.

BACKGROUND OF THE INVENTION

1. Field of the Invention

The present invention relates to a voltage controlled oscillator for controlling an output signal frequency in accordance with an input voltage, and particularly, to a voltage controlled oscillator having improved C/N characteristics.

2. Description of the Related Art

Japanese Patent Laid-Open Publication No. 8-148933 discloses a conventional voltage controlled oscillator, the objective of which is to improve C/N characteristics. This device will be explained with reference to FIG. 3.

In general, a voltage controlled oscillator may be used for mobile communication equipment, for use in the 900 MHz band for example. The oscillator basically comprises: a resonance circuit 1 having a resonance frequency which changes according to a control voltage applied to a control terminal C; an oscillation circuit 2 having an oscillation frequency which is determined depending on the resonance frequency of the resonance circuit 1; a buffer circuit 3 for amplifying a signal outputted from the oscillation circuit 2 and for preventing an oscillation frequency from fluctuating due to load fluctuation; and an output matching circuit 4 for matching the impedance of an external circuit, not shown, connected to the output terminal P and for suppressing a higher harmonic component. Each circuit component of the voltage controlled circuit thus configured is formed by incorporating a plurality of electronic component functions to be described later on or inside a multilayered circuit board formed by simultaneously baking a plurality of laminated ceramic sheets, each having a circuit pattern printed thereon.

The resonance circuit 1 comprises a coupling capacitor C1, a variable-capacitance diode VD, a resonance inductor L1, and a resonance capacitor C2. A control voltage Vc applied to the control terminal C is supplied to the variable-capacitance diode VD via a choke coil L2. Note that the control terminal C is grounded with respect to a high frequency by a high frequency bypass capacitor C3.

The oscillation circuit 2 comprises an oscillation transistor Q1 as an active component, bias resistors R1, R2, and R3, Colpitts capacitors C4 and C5, a high frequency bypass capacitor C6, a strip line SL connected in series with the bias resistor R3, and a chip capacitor Cc connected in parallel with the strip line SL. The strip line SL and the chip capacitor Cc constitute a parallel oscillation circuit. The oscillation circuit 2 is connected to the resonance circuit 1 via a coupling capacitor C7.

Additionally, the bias resistor R3 determines the direct current bias of the emitter as a current output terminal of the oscillation transistor Q1.

The buffer circuit 3 comprises a buffer transistor Q2 and bias resistors R4 and R5. The buffer circuit 3 is connected to the oscillation circuit 2 via a coupling capacitor C8.

The output matching circuit 4 comprises a choke coil L3, a coupling capacitor C10, a high frequency bypass capacitor C11, and the output terminal P.

Note that a driving power supply terminal B provides a voltage $V_B$ as a driving power source to the oscillation transistor Q1, and the buffering transistor Q2 is grounded with respect to a high frequency by a bypass capacitor 12.

Additionally, a resonance frequency of the resonance circuit 1 changes by changing the capacitance of the variable capacitance diode VD in response to a value of a control voltage Vc. Further, an oscillation circuit 2 oscillates at the resonance frequency, and its signal is outputted from the terminal P.

The Q of the resonance circuit 1 is most significantly affected by the impedance of the emitter of the oscillation transistor Q1, which is a load of the resonance circuit 1. The higher the impedance of the emitter, the lower the amount of degradation of the Q of the resonance circuit 1. This results in improvement in the C/N characteristics of the voltage controlled oscillator.

In a voltage controlled oscillator thus configured, in a parallel resonance circuit comprising the strip line SL and the chip capacitor Cc, the resonance frequency of the strip line SL and the chip capacitor Cc is made to match a predetermined frequency to raise the impedance of the emitter of the transistor Q1 at a predetermined frequency by separately changing the inductance of the strip line SL and the capacitance of the chip capacitor Cc. This improves the C/N characteristics of the voltage control oscillator.

However, in the conventional voltage controlled oscillator described above, generally, the resonance inductance L1 of the resonance circuit 1 is configured by a strip line resonator. Accordingly, there are two strip lines, i.e., a strip line resonator as the resonance inductance L1, and a strip line SL within the oscillation circuit 2.

These strip lines are formed as a circuit pattern on a multilayered circuit board (not shown). In order for both of the strip lines to secure a sufficient characteristics, a certain degree of length is required. Thus, to maintain sufficient characteristics, enlargement of the multilayer circuit board is required. Since the size of the voltage control oscillator itself is enlarged, it has been difficult to meet the market demand for compactness of the voltage controlled oscillator.

Additionally, since a strip line resonator and a strip line SL are provided in one multilayered circuit board, electric bonding (e.g., coupling) between strip lines is generated. As a result, Q in this resonance system is lowered, and a C/N characteristics are degraded.

Hence, the present invention is made to solve at least the problem described above, and one object of the present invention is to provide a voltage controlled oscillator for improving C/N characteristics and which can be easily made more compact.

SUMMARY OF THE INVENTION

Accordingly, to attain the object described above, the present invention provides a voltage controlled oscillator comprising a resonance circuit having a resonator including a strip line or a microstrip line, one end of which is grounded, and an oscillation circuit including an active component for oscillation, wherein the active component is grounded via the resonator.

The arrangement may be such that the active element is a transistor having an emitter, the emitter of the transistor being connected to one end of a bias resistor, which determines the DC bias of a current output terminal of the transistor, the other end of the resistor being connected to one end of a capacitor, the other end of the capacitor being grounded, thereby grounding the emitter via the resistor and the capacitor. Further, a node between the bias resistor and the capacitor is connected to the resonator, thereby grounding the emitter of the transistor via the resonator.

Alternatively, the emitter of the transistor may be connected to one end of the bias resistor, which determines the DC bias of a current output terminal of the transistor, and the other end of the bias resistor being connected only to the resonator, thereby grounding the emitter of the transistor via the resonator.

Accordingly, a strip line as a resonator also serves as a strip line provided in the emitter of an oscillation transistor in the conventional voltage controlled oscillator, thereby reducing the number of strip lines.

In addition, a resonator and a capacitor constitute a parallel resonance circuit, and by changing the inductance of the strip line and the capacitance of the capacitor, the C/N characteristics can be improved.

Further, increasing the impedance of the emitter of the transistor by changing the inductance of the strip line enables C/N characteristics to be improved without the use of a capacitor conventionally required. Additionally, there is a decrease in the number of components needed.

BRIEF DESCRIPTION OF THE DRAWINGS

The foregoing, and other, objects, features and advantages of the present invention will be more readily understood upon reading the following detailed description in conjunction with the drawings in which.

DESCRIPTION OF THE PREFERRED EMBODIMENT

Hereinbelow, an embodiment according to the present invention will be explained in detail with reference to drawings.

Figure 1:
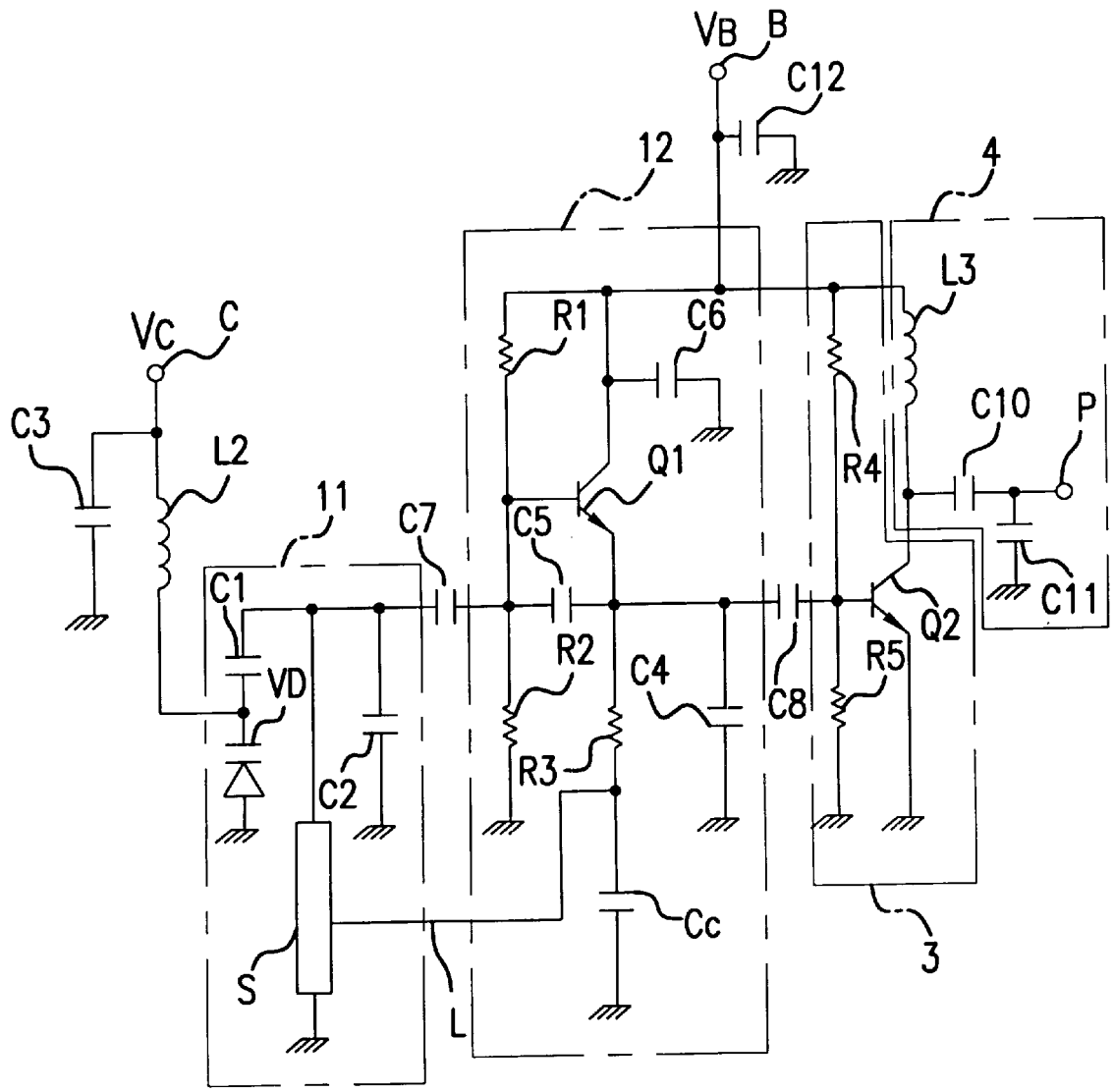
FIG. 1 is a circuit diagram showing a configuration of a voltage controlled oscillator according to an exemplary embodiment of the present invention.
Figure 3:
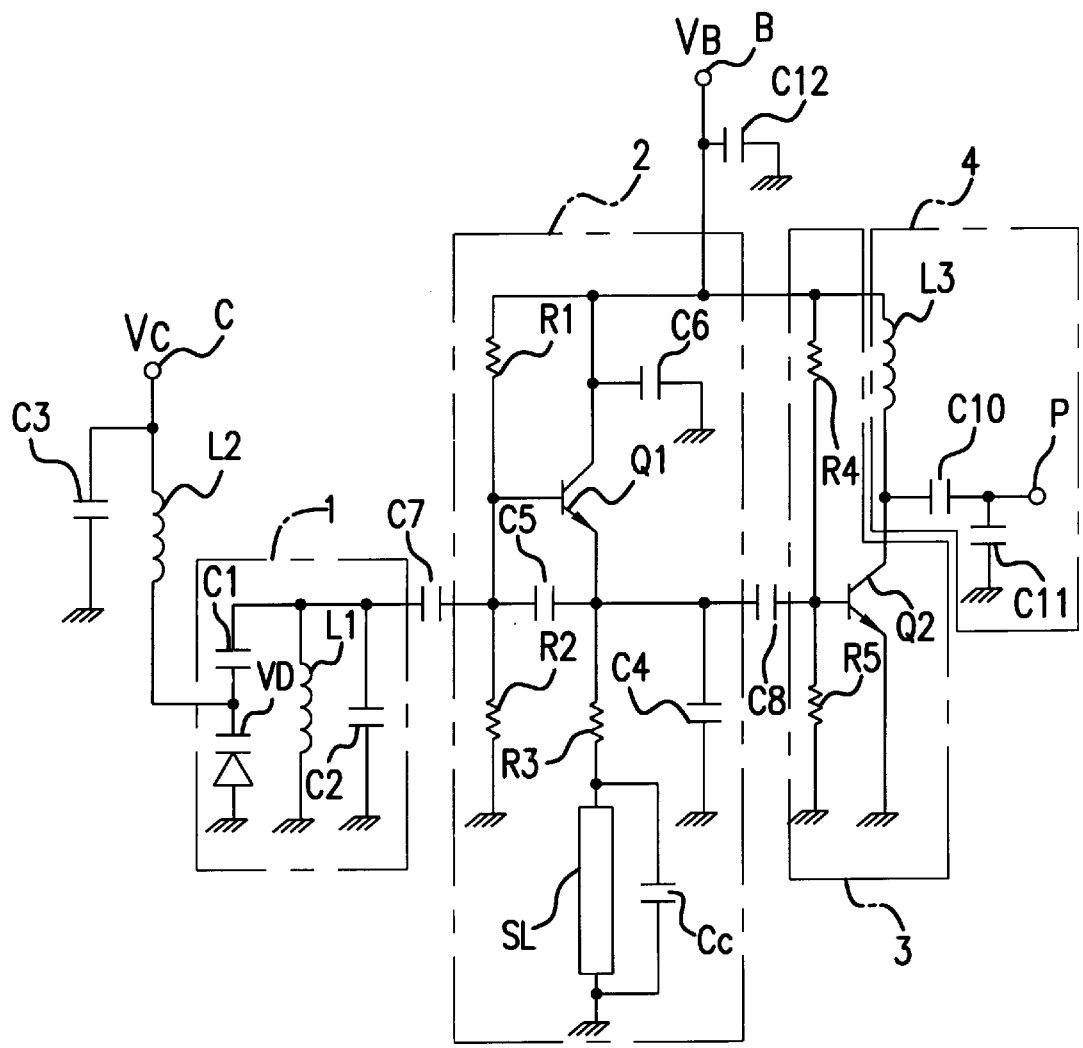
FIG. 3 is a circuit diagram showing a configuration of a conventional voltage controlled oscillator.

FIG. 1 is circuit diagram showing a voltage controlled oscillator according to the first embodiment of the present invention. The same reference numerals are assigned to the identical (or similar) elements in FIG. 3 showing a conventional voltage controlled oscillator.

The voltage controlled oscillator according to the present invention differs from the above-described conventional voltage controlled oscillator in its resonance circuit and oscillation circuit.

More specifically, the resonance circuit 11 comprises a coupling capacitor C1, a resonance capacitor C2, a variable capacitance diode VD and a resonator comprising a strip line S. One end of the resonator S is grounded. A control voltage Vc applied to the control terminal C is applied to a variable capacitance diode VD via a choke coil L2. Note that a control terminal C is grounded with respect to a high frequency component via a high frequency bypass capacitor C3.

The oscillation circuit 12 comprises an oscillation transistor Q1 as an active component, bias resistors R1, R2, and R3, Colpitts capacitors C4 and C5, a high frequency bypass capacitor C6, and a chip capacitor Cc one end of which is connected to the bias resistor R3 in series and the other end of which is grounded. The oscillation circuit 12 is connected to the resonance circuit 11 via a coupling capacitor C7. In addition, the bias resistor R3 determines the DC bias of an emitter as a current output terminal of the oscillation transistor Q1. The emitter of the oscillation transistor Q1 is grounded via a series circuit comprising the bias resistor R3 and the chip capacitor Cc.

Additionally, a node between the bias resistor R3 and the chip capacitor Cc is connected to the resonator S comprising a strip line within the resonance circuit 11 via a connection line L. This causes the emitter of the oscillation transistor Q1 in the oscillation circuit 12 to be grounded. Also, the resonator S and the chip capacitor Cc constitute a parallel resonance circuit.

In the voltage controlled oscillator thus configured, the resonator S functions as a strip line connected to the emitter of the oscillation resistor Q1. In the parallel resonance circuit comprising the resonator S and the chip capacitor Cc, the length of the strip line and the capacitance of the chip capacitor are predetermined in such a manner that at the resonance frequency (for example, in the 900 MHz band in the embodiment according to the present invention) these components are made open-circuited with respect to an alternating current.

That is, the resonance frequency of the parallel resonance circuit is tuned to the 900 MHz band by separately changing the inductance of the resonator S comprising a strip line of the resonance circuit 11 and the capacitance of the chip capacitor Cc, thereby increasing the impedance of the emitter of the transistor Q1 in the 900 MHz band. This causes the C/N characteristics of a voltage controlled oscillator to be improved.

In the voltage controlled oscillator thus configured, the number of strip lines is decreased in comparison with a conventional voltage controlled oscillator, and the wiring pattern in the multilayered circuit board can be simplified. Hence, reduction in the size of the voltage controlled oscillator is achieved.

That is, in a multilayered circuit board (not shown) which consists of a voltage controlled oscillator, the printed pattern can be simplified, e.g., one strip line can be eliminated. Thus, an area required for the oscillator can be reduced.

The length of a strip line functioning as a parallel resonance circuit is determined according to the location of the connection line L extending out from a node between the bias resistor R3 and the chip capacitor Cc, and the location of the connection is determined according to either the frequency band in which voltage controlled oscillator is to be used or the capacitance of the chip capacitor.

Figure 2:
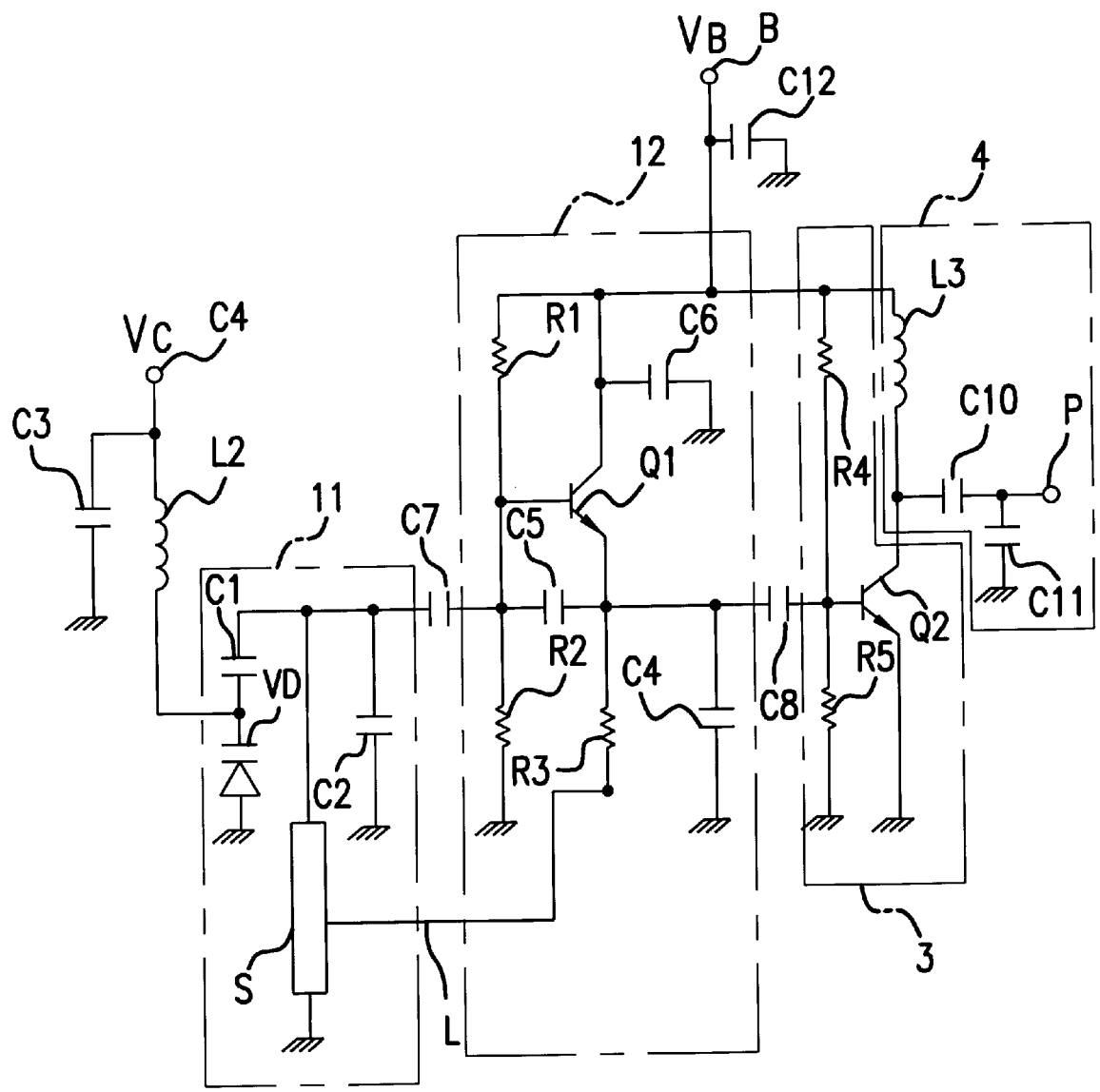
FIG. 2 is a circuit diagram showing a configuration of a voltage controlled oscillator according to another exemplary embodiment of the present invention.

Additionally, when sufficient impedance is obtained by one strip line only, the chip capacitor can be eliminated as shown in FIG. 2. Thus, the circuit constituting a voltage controlled oscillator can further be simplified. This causes the size of the voltage controlled oscillator to be reduced.

For the embodiment described above, the case of a resonator S comprising a strip line was explained. However, the resonator S may comprise a microstrip line, which performs the same function.

In the embodiment described above, an oscillation transistor Q1 is used as the active component. However, the active component is not limited to this kind of transistor, and for example, an FET can be used, instead. The selection of what type of active component is to be used can be made according to the application.

As described above, in the voltage controlled oscillator according to the present invention, a resonator strip line also serves as a strip line connected to the emitter of an oscillation transistor provided in the conventional voltage controlled oscillator. Thus, the number of strip lines can be decreased, and therefore can be reduced. Hence, the size of the voltage controlled oscillator can be made smaller.

A resonator and a capacitor constitute a parallel resonance circuit, and by changing the inductance of the strip line and the capacitance of the capacitor, C/N characteristics can be improved.

Further, increasing impedance of the emitter of the transistor by changing inductance of a strip line enables the C/N characteristics to be improved without the use of a capacitor conventionally required. Additionally, the number of components required can be decreased, thus resulting in reduction of the total cost including the unit price. Further, the circuit is simplified, which achieves a downsized voltage controlled oscillator.

The above-described exemplary embodiments are intended to be illustrative in all respects, rather than restrictive, of the present invention. Thus the present invention is capable of many variations in detailed implementation that can be derived from the description contained herein by a person skilled in the art. All such variations and modifications are considered to be within the scope and spirit of the present invention as defined by the following claims.

What is claimed is:

1. A voltage controlled oscillator comprising:
    a resonance circuit including a resonator comprising one of a strip line or a microstrip line, one end of which is grounded; and
    an oscillation circuit including an active component for providing oscillation, said active component being connected to a capacitor which forms a parallel resonance circuit with said resonator;
    wherein said active component is grounded via said resonator.

2. A voltage controlled oscillator according to claim 1, wherein said active component comprises a transistor having an emitter, wherein the emitter of said transistor is connected to one end of a resistor which determines a DC bias of a current output terminal of said transistor, the other end of said resistor being connected to one end of said capacitor, the other end of said capacitor being grounded, whereby said emitter is grounded via said resistor and said capacitor, and a node between said resistor and said capacitor is connected to said resonator, whereby said emitter of said transistor is grounded via said resonator.

3. A voltage controlled oscillator according to claim 2, wherein a connection line connects said node with said resonator.

4. A voltage controlled oscillator according to claim 1, wherein the resonance circuit comprises a coupling capacitor, a resonance capacitor, a variable capacitance diode and said resonator, wherein said coupling capacitor and said variable capacitance diode are connected in series, wherein one end of each of said coupling capacitor, said resonator and said resonance capacitor are connected to said oscillation circuit, and wherein one end of said variable capacitance diode is grounded.

5. A voltage controlled oscillator according to claim 1, wherein said active component comprises a transistor having an emitter, a collector and a base, wherein the oscillation circuit comprises first and second bias resistors connected in series and having a node located therebetween which is connected to the base of the transistor, first and second Colpitts capacitors both connected to the emitter, and a high frequency bypass capacitor connected between the collector of said transistor and ground.

6. A voltage controlled oscillator according to claim 1, further including a control terminal for applying a control voltage to the resonance circuit via a choke coil.

7. A voltage controlled oscillator according to claim 6, wherein the control terminal is grounded with respect to a high frequency component via a high frequency bypass capacitor.

8. A voltage controlled oscillator according to claim 1, wherein the oscillation circuit is connected to the resonance circuit via a coupling capacitor.

9. A voltage controlled oscillator according to claim 1, wherein an output of said oscillation circuit is connected to a buffer circuit.

10. A voltage controlled oscillator according to claim 9, wherein an output of said buffer circuit is connected to an output matching circuit.

11. A voltage controlled oscillator according to claim 1, wherein said active element comprises a FET.

12. A voltage controlled oscillator comprising:
    a resonance circuit including a resonator comprising one of a strip line or a microstrip line, one end of which is grounded; and
    an oscillation circuit including a capacitor and an active component for providing oscillation, wherein said active component comprises a transistor having an emitter;
    wherein the emitter of said transistor is connected to one end of a resistor determining a DC bias of a current output terminal of said transistor, and the other end of said resistor is connected only to said resonator;
    wherein one end of the capacitor is connected to both the emitter and the resistor, and the other end of the capacitor is connected to ground;
    whereby said emitter of said transistor is grounded via said resonator.

13. A voltage controlled oscillator according to claim 12, wherein said other end of said resistor is connected to said resonator via a connection line.

* * * * *